Figure 1:
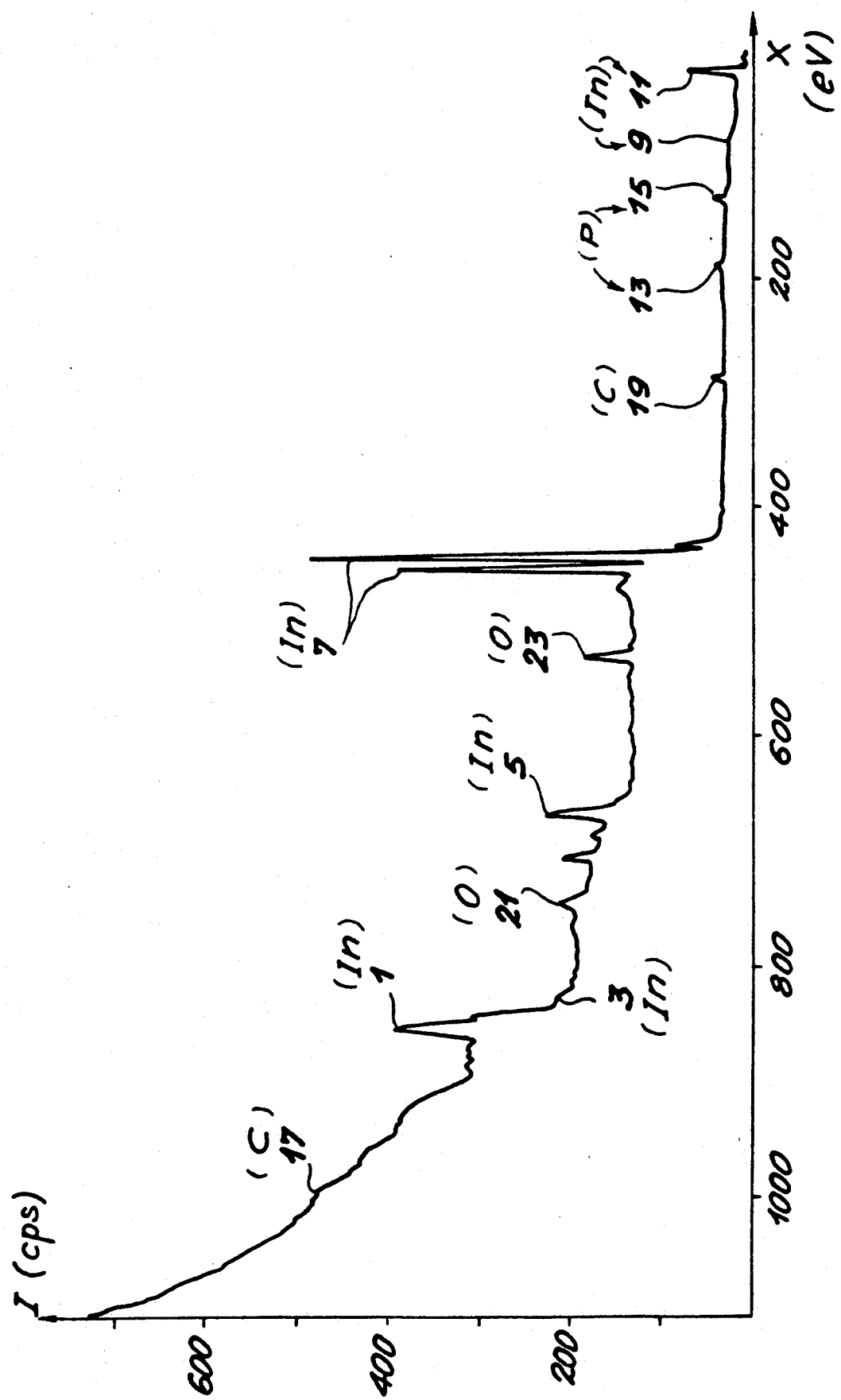
Figure 2A:
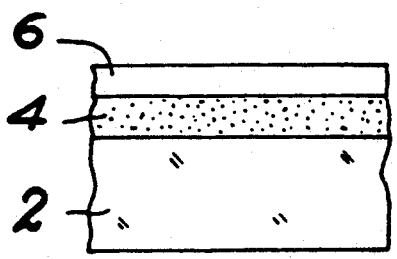
Figure 2B:
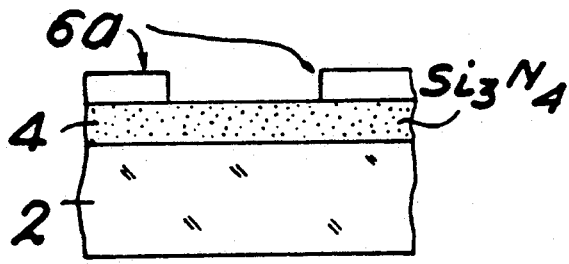
Figure 2C:
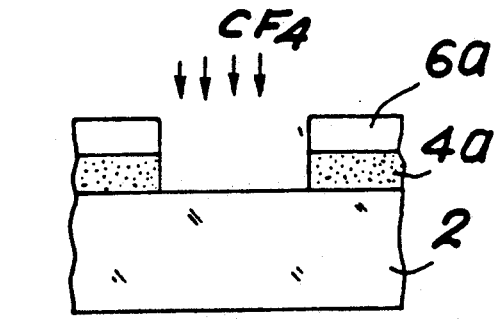
Figure 2D:
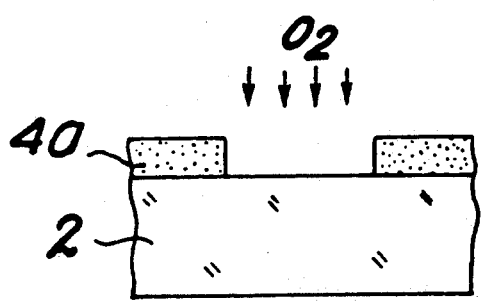

United States Patent [19]

Henry et al.

[11] Patent Number: 5,074,955
[45] Date of Patent: Dec. 24, 1991

[54] PROCESS FOR THE ANISOTROPIC ETCHING OF A III-V MATERIAL AND APPLICATION TO THE SURFACE TREATMENT FOR EPITAXIAL GROWTH

[75] Inventors: Loïc Henry; Claude Vaudry, both of Lannion, France

[73] Assignee: L'Etat Francais represente par le Ministre des Postes, des Telecommunications et de l'Espace (C.N.E.T.), Issy les Moulineaux, France

[21] Appl. No.: 568,871

[22] Filed: Aug. 17, 1990

Related U.S. Application Data

[63] Continuation of Ser. No. 195,867, May 19, 1988, abandoned.

[30] Foreign Application Priority Data

May 21, 1987 [FR] France .................................. 87 07135

[51] Int. Cl.$^5$ ............................................. H01L 21/00
[52] U.S. Cl. ..................................... 156/643; 156/646; 156/662; 437/228
[58] Field of Search ............... 156/643, 646, 662, 655, 156/657; 204/192.35; 437/228

[56] References Cited

PUBLICATIONS

Niggebrügge et al., "A Novel Process for Reactive Ion Etching on InP, Using $CH_4/H_2$"; Process Technologies, 1986, pp. 367–372.

Primary Examiner—David A. Simmons
Assistant Examiner—Thi Dang
Attorney, Agent, or Firm—Oblon, Spivak, McClelland, Maier & Neustadt

[57] ABSTRACT

Process for the anisotropic etching of a III-V material and application to surface treatment for epitaxial growth.

This process includes the step of etching a III-V material (2) by reactive ionic etching using a gaseous mixture containing by volume 20 to 30% of at least one gaseous hydrocarbon, 30 to 50% of at least one inert gas and 20 to 50% of hydrogen.

Said etching can be performed locally with the aid of a $Si_3N_4$ etching mask (4a).

14 Claims, 4 Drawing Sheets

FIG.5a
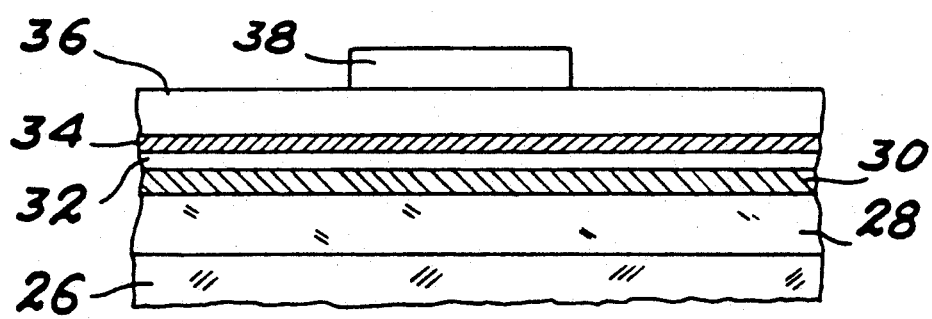
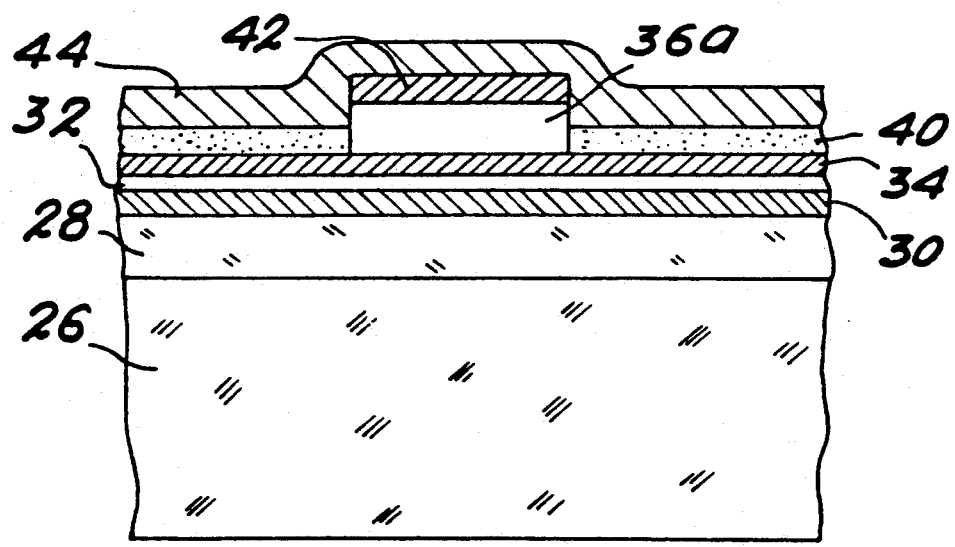
FIG.5b

PROCESS FOR THE ANISOTROPIC ETCHING OF A III-V MATERIAL AND APPLICATION TO THE SURFACE TREATMENT FOR EPITAXIAL GROWTH This is a continuation of application Ser. No. 07/195,867, filed on May 19, 1988, now abandoned.

DESCRIPTION

The present invention relates to an anisotropic etching process of the reactive ionic type of a III-V material making it possible to produce epitaxied semiconductor structures usable in the field of microelectronics and telecommunications.

The invention can more particularly be used for producing a large number of components such as diodes, transistors, charge transfer devices, memories, lasers, photodetectors, optical guides, networks, etc., as well as for the integration of said components on the same substrate. These components can be produced in homostructure or heterostructure form.

It is pointed out that a III-V material is a material containing at least one element of column III and at least one element of column V of the periodic classification of elements. The production of semiconductor structures of III-V material generally involves etching a III-V material substrate or layer.

In connection with the etching of such materials, the so-called wet methods are limited by the isotropic nature of the chemical etching process, which does not make it possible to obtain etched patterns in the micron or submicron ranges. Moreover, wet etching lacks reproducibility with respect to the etching speed, which sometimes causes problems during the industrial production of electronic components such as MESFET transistors and lasers.

Dry etching methods used in silicon microelectronics have recently been used for etching III-V semiconductors. Unfortunately, the fluorine gases most widely used in silicon technology are not suitable for III-V compounds in view of the fact that the reaction products obtained are not volatile. It is for this reason that the gases used for etching III-V materials are generally chlorine or bromine gases such as $SiCl_4$, $Cl_4$, $CF_2Cl_2$, $BCl_3$, $Cl_2$ or $Br_2$.

However, the use of such chlorine or bromine gases causes numerous problems in connection with the safety and corrosion of the etching equipment. Moreover, certain laboratories have found that reliability problems exist with regards to components produced with a chlorine reactive ionic etching stage. It has in particular been found that chlorine residues are left behind on the surface of the etched material and then react with the contact metallizations.

More recently consideration has been given to the etching of InP with a mixture of $CH_4$ and hydrogen, as described in the article Inst. Phys. Conf. Ser. No. 79, chapter 6-1986 by U. Niggebrügge et al, p.367 entitled "A Novel Process for Reactive Ion Etching on InP using $CH_4/H_2$". The etchings are produced by using a photosensitive resin mask.

This known process suffers from a certain number of disadvantages. In particular on the surface of the resin mask is formed a thick, non-homogeneous polymer layer by reaction between the gases $CH_4$ and $H_2$ which is very difficult to remove, even when using a high power oxygen plasma in the manner indicated in the publication. Due to the formation of these polymers, the resin mask is very difficult to remove. Moreover, the etching process is not reproducible.

Furthermore, the surface state of the etched material is not of an adequate quality for numerous applications. The etching flanks or sides have too many irregularities and the radiofrequency power used for ionizing the gases is very high, which can lead to a deterioration of the surface of the etched material by ion bombardment.

Ionic machining or working is another known method for etching III-V materials. This method is more particularly used for producing buried or embedded optical guides. Unfortunately this etching method is not very selective, which requires the use of very thick masks (several micrometers) made from a refractory material, e.g. titanium. Moreover, the nature and quantity of the material necessary for producing these masks makes the method very expensive.

The object of the present invention is consequently to find etching conditions giving both an anisotropic etching and a smooth surface state of the etched material, without residue on the etching bases. Moreover, the surface state of the etched parts must be good so that, without any other treatment, it is possible to deposite a semiconductor layer by epitaxy, or deposit insulating layers or conductive layers.

Moreover, it must be possible to easily modify the etching speed so as to very accurately control the etched depths. This parameter is very important because it is very often necessary when producing semiconductor devices to etch limited thicknesses (less than $300 \text{ nm} \pm 5\%$ for a FET transistor on GaAs) or control the stopping of etching at an interface (e.g. case of laser heterostructures).

However, in order to achieve these objectives, the major difficulty is the choice of the etching gas. It is therefore necessary to find a gaseous mixture which, under the effect of radiofrequency waves, has the same reaction kinetics with the elements of column III (Al, Ga, In) and those of column V (P, As, Sb). Moreover, the III-V compounds to be etched are of widely differing types. Thus, the materials to be etched can be solid materials, or can be superimposed layers with different composition or doping characteristics.

The invention more particularly relates to a process for the reactive ionic etching of III-V material making it possible to obviate the disadvantages referred to hereinbefore, whilst satisfying the aforementioned requirements. In particular, the inventive process is perfectly reproducible and anisotropic. The etched parts are of good quality and the etching bases have a smooth surface. Moreover, it is easy to modify the etching speeds.

More specifically, the invention relates to a process for the reactive ionic etching of a III-V material using a gaseous mixture, characterized in that the gaseous mixture contains by volume more than 15% of at least one gaseous hydrocarbon and less than 40% of said hydrocarbon, more than 20% of at least one inert gas and less than 55% of said inert gas and more than 5% of hydrogen and less than 65% of hydrogen.

Obviously, the mixture must contain a maximum of 100% by volume of gas.

The inert gas can be constituted by nitrogen or a rare gas such as neon, argon, krypton, xenon or a mixture of said gases. Preference is given to the use of argon.

The use of a quantity of inert gas, particularly argon, exceeding 55% leads to a predeominance of ionic etching due to the inert gas-hydrogen mixture compared with reactive etching, which is due to the reaction of the hydrogen and the hydrocarbon with the III-V material. However, an inert gas quantity below 20% leads to the formation of a rough etching base and to poor quality etching sides.

Moreover, an excessive gaseous hydrocarbon quantity at least equal to 40% favours the formation of polymers and etching isotropy, which is highly prejudicial during local etching necessitating the use of an etching mask, whilst an inadequate hydrocarbon quantity at the most equal to 15% is not adequate to permit reactions of the metallo-organic type with elements III of the material to be etched.

It is surprising to see that a large quantity of rare gas, particularly argon, which can reach up to more than 50% by volume, leads to an excellent etching quality, because it is well known that argon alone is currently used for ionic working, which corresponds to a destruction of the surface state of the III-V material.

The inert gas proportion in the gaseous mixture is very high in order to obtain good quality etching. Preference is given to the use of at least 30% of rare gas, whereby the hydrogen and hydrocarbon quantities are then chosen in such a way that the reaction kinetics of the hydrocarbon with element III and the hydrogen with element V are identical. Thus, the gaseous hydrocarbon reacts with element III to form metallo-organic compounds, whereas the hydrogen reacts with element V to form hydrides.

In the particular case of $CH_4$ as the hydrocarbon and indium or gallium as element V, compounds of the trimethyl indium or trimethyl gallium type are formed which are volatile compounds. In the same way, hydrogen with arsenic and phosphorus respectively form the hydrides $AsH_3$ and $PH_3$, which are also volatile.

In these chemical processes, argon seems to activate the surface to be etched whilst exciting there the atoms of elements III and V, thus aiding the respective reactions of these elements with the alkyl $C_nH_{2n+1}$ and hydrogen H radicals resulting from the excitation of the hydrocarbon and $H_2$ by the radio-frequency waves.

According to the invention, it is possible to use one or more gaseous hydrocarbons, which may or may not be saturated and must not contain too much carbon in order to limit or prevent the formation of polymers on the etching mask used when carrying out local etching.

To this end, it is advantageous to use hydrocarbons with 1 to 4 carbon atoms, such as e.g. methane, ethane, propane, ethylene and acetylene. Preference is given to the use of methane.

Advantageously, use is made of a gaseous mixture containing by volume 20 to 30% of at least one gaseous hydrocarbon and preferably methane, 30 to 50% of at least one inert gas and preferably argon and 20 to 50% of hydrogen.

The process according to the invention is applicable to a large number of materials such as $Ga_{1-x}As_xP$, GaP, GaSb, $Ga_{1-x}In_xAs_{1-y}Sb_y$, $Ga_{1-x}As_xSb$, $Ga_{1-x}Al_xAs_{1-y}Sb_y$, $InAs_xSb_{1-x}$, InAs, $InAs_{1-x}P_x$, $AlAs_{1-x}Sb_x$ or AsSb with $0 \leq x \leq 1$ and $0 \leq y \leq 1$.

However, the invention is more particularly applicable to the material InP, GaAs, GaSb, $Ga_{1-x}In_xAs$, $Ga_{1-x}In_xAs_{1-y}P_y$ and $Ga_{1-x}Al_xAs$ with $0 \leq x \leq 1$ and $0 \leq y \leq 1$, the most widely used in microelectronics.

The III-V material to be etched can be a solid substrate or a semiconductor layer resting on a solid substrate or on a pile of semiconductor layers of different types.

The etching process according to the invention can be performed for a random orientation of the crystal planes of the material to be etched, in view of the fact that said process is independent of these crystal planes.

In order to favour the evacuation of the organo metals formed and prevent their redeposition in the presence of radio-frequency exciting waves, the ionic etching according to the invention must be performed in a vacuum enclosure with a high pumping rate at least equal to 150 m$^3$/h.

Apart from the composition of the gaseous mixture used for obtained etching of adequate quality, the pressures of said mixture are also important. In particular, the pressure of the mixture must be between 1 and 4 Pa, preferably between 1.5 and 3 Pa. In the same way, the power of the radiofrequency waves used must vary from 10 to 250 watts and preferably 10 to 150 watts.

By acting on the pressure of the gases, the pumping speed, the composition of the gases and the radiofrequency power, it is possible to vary the etching speed or rate, which permits a very accurate control of the etched depths, thus making it possible to selectively etch a pile of III-V material layers. In particular, it is possible to etch piles of the GaInAs/InP/GaInAs/InP or GaInAsP/InP/GaInAs/InP types.

The etching speed increases with the pressure of the gases, the radiofrequency power, the quantity of rare gas and decreases if the pumping speed increases. Moreover, the etching quality decreases with the etching speed, an etching speed of 10 to 80 nm/min being completely satisfactory.

The process according to the invention can be used for the surface and depth etching of all or part of a III-V material.

A surface etching of the complete plate type (i.e. without etching mask) of the entire material can be advantageously used as a preparation stage of an untreated substrate with a view to effecting thereon the deposition of one or more III-V material layers by epitaxy.

In other words, the etching process according to the invention can constitute a surface preparation stage of a III-V substrate requiring no other preparation stage of said surface, apart from a possible deoxidation, prior to the epitaxy of a III-V material semiconductor layer with a composition identical to or different from that of the substrate.

Thus, the inventors have found that an epitaxy performed on a substrate prepared according to the invention had crystalline qualities equivalent to an epitaxy performed on a substrate chemically cleaned in a wet medium.

In order to produce a semiconductor structure, it is generally necessary to carry out local etchings of a III-V material requiring the use of an etching mask representing the image of the etchings to be performed.

For this local etching to be successful, it is necessary for the mask to be only slightly etched or unetched during the etching of the III-V material. In other words, the selectivity S of the etching must satisfy the following condition: S=etching speed of III-V material/etching speed of the mask>>at 1.

Moreover, the etching mask must be easy to remove and the III-V material must not be damaged by removing the mask.

According to the invention, the etching mask can be made from negative or positive photosensitive resin, from an insulating material such as $Si_3N_4$ or $SiO_2$, or a metal such as titanium or aluminium.

In view of the fact that the gaseous hydrocarbon quantity present in the etching mixture is below that used in the aforementioned Niggebrügge article, the layer of polymers optionally formed above the etching mask is homogeneous and consequently causes no problem with regards to its elimination by an oxygen plasma.

According to the invention, a photosensitive resin mask can be eliminated with the aid of an oxygen plasma, a $SiO_2$ mask with a $CHF_3$ or $CF_4$ plasma and a titanium or aluminium mask respectively with a $HF+H_2O_2+H_2O$.

Advantageously, use is made of a $Si_3N_4$ mask, in view of the fact that it is not attacked by the etching plasma according to the invention and is easy to dissolve in pure or dilute hydrofluoric acid. The fine layer of polymers which may possibly be deposited on said mask during the etching of III-V material is then raised and detached.

The epitaxy of a semiconductor layer on a III-V material which has undergone reactive ionic etching or cleaning according to the invention as the surface preparation stage can be of the molecular beam etching type (MBE), metallo-organic chemical vapour decomposition type (MOCVD) using chemical reactions which are the reverse of those used in the etching of the III-V material, or even a liquid phase epitaxy (LPE).

Other features and advantages of the invention can be gathered from the following description of non-limitative embodiments and with reference to the attached drawings, wherein show:

FIG. 1: XPS photoelectron spectroscopy of a InP substrate etched according to the inventive process.

FIGS. 2 and 3: The different stages of producing a semiconductor layer buried or embedded in a III-V material in a semiinsulating substrate of III-V material using the etching process according to the invention.

Figure 4A:
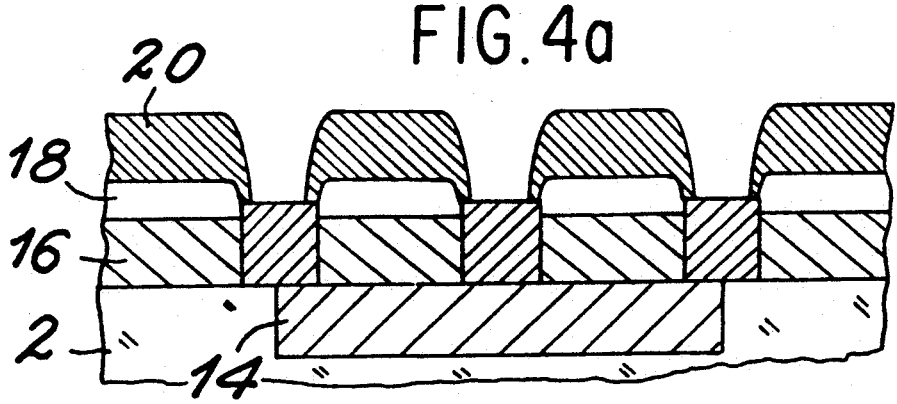
Figure 4B:
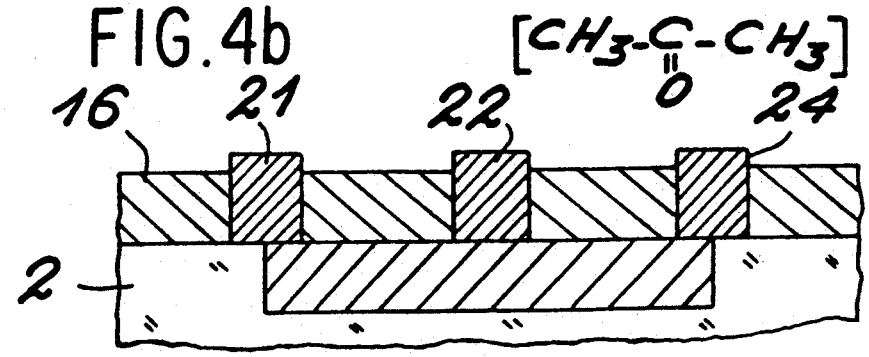

FIG. 4: The various stages of producing a MESFET transistor having a buried semiconductor layer.

FIG. 5: The production of a laser source using the etching process according to the invention.

The inventive process consists of anisotropically etching a III-V material using a gaseous plasma formed by radiofrequency excitation of a gaseous mixture containing by volume $15\% < CH_4 < 40\%$, $20\% < Ar < 55\%$ and $5\% < H_2 < 65\%$. This etching is carried out under a gaseous pressure between 1 and 4 Pa with a radiofrequency power between 10 and 250 watts.

It can be carried out in any presently known reactive ionic etching apparatus (RIE). The operating principle of a certain number of RIE means is described in the document VLSI Technology published in the International Student Edition.

It can be gathered that the use of a pressure at the most equal to 1 Pa or a pressure at least equal to 4 Pa does not make it possible to obtain anisotropic etching of adequate quality.

Thus, a too low pressure leads to granular etching bases, whereas a too high pressure leads to concave etched flanks, which are therefore not abrupt, as well as an excessive overetching at the foot of the etching flanks.

The etching process according to the invention makes it possible to obtain etched zones of good crystalline quality not having any metallic pollution, contrary to what generally happens in plasma reactors (the metallic pollution coming from the radiofrequency electrodes and the metal walls of the reactor). This can be clearly gathered from the XPS spectroscopy of FIG. 1 performed on a solid InP substrate with a gaseous mixture $CH_4+H_2+Ar$ of composition $20/30/50\%$ by volume, under a pressure of 2.2 Pa, a radiofrequency power of 100 W and a pumping rate of 300 $m^3/h$.

The photoelectron intensity I emitted by the sample, on the ordinate, is expressed in cps and the energy of the X-rays on the abscissa, is expressed in electron volts.

The most numerous emission peaks 1, 3, 5, 7, 9 and 11 are due to the indium of the substrate, peaks 13 and 15 to the phosphorus of the substrate and peaks 17 and 19 to carbon impurities resulting from reexposure to the air of the sample. The same applies with regards to the oxygen impurities corresponding to the emission peaks 21 and 23. These traces of C and $O_2$ are of negligible quantity. No peak due to the presence of metallic impurities in the sample appears on the emission spectrum.

The etching process according to the invention can be used for producing semiconductor structures more particularly having an epitaxied, buried semiconductor layer, such as MESFET transistors, light guides and networks. To this end, FIGS. 2 and 3 show the different stages of producing an epitaxied, buried semiconductor layer. The first stages of said production shown in FIG. 2 illustrate the preparation stages of a silicon nitride mask to be used for etching a III-V semi insulating material.

The semi insulating substrate 2, e.g. of InP, as indicated in (a), is firstly covered with a 4 to 100 nm thick silicon nitride layer by reactive cathodic sputtering or by chemical vapour phase deposition, followed by a positive photosensitive resin layer 6, like that conventionally used in photolithography (e.g. AZ Shippley) over a thickness of approximately 1000 nm.

Through a photomask representing the image of the etching to be carried out in substrate 2, in ultraviolet light irradiation takes place of the resin, followed by the development thereof, the non-irradiated regions of the resin then being dissolved. This gives the photolithography mask 6a shown in part (b) of FIG. 2.

This is followed by the etching of the silicon nitride layer 4 through mask 6a with the aid of a $CF_4$ plasma. As shown in part (c), this etching makes it possible to eliminate non-resin-covered silicon nitride layer regions. The resin mask 6a is then eliminated by an oxygen plasma. The silicon nitride mask 4a obtained and represented at (d) can then be used as the etching mask for the semi insulating substrate 2.

As a variant, it is possible to use an etching mask formed from a two-layer material $SiO_2$—$Si_3N_4$. Then, the elimination of the regions of the substrate not covered by $Si_3N_4$ are eliminated in the manner shown in part (a) of FIG. 3. This etching is carried out with a gaseous mixture $CH_4+H_2+Ar$ with a gaseous composition in volume % of 20/30/50, under a gas pressure of 2.2 Pa, a continuous pumping at 300 $m^3/h$ and a radiofrequency power of 100 watts. Under these conditions, an InP etching speed of 60 to 70 nm/min is obtained.

For producing a MESFET, the depth p of the etched zone 2a of substrate 2 is approximately 200 nm and its width a few micrometers. In the same way, for producing a buried optical guide, the etching depth p is close to 3 μm and the width L of the etched zone 2a approximately 2 μm.

In parallel to the local etching of substrate 2, a thin homogeneous film 8 of polymers is formed on the surface of the $Si_3N_4$ mask 4a. With the aid of a concentrated or dilute hydrofluoric acid solution, in the manner shown in part (b) of FIG. 3, all the etching mask 4a and the possibly formed polymer film 8 are eliminated.

Figure 3A:
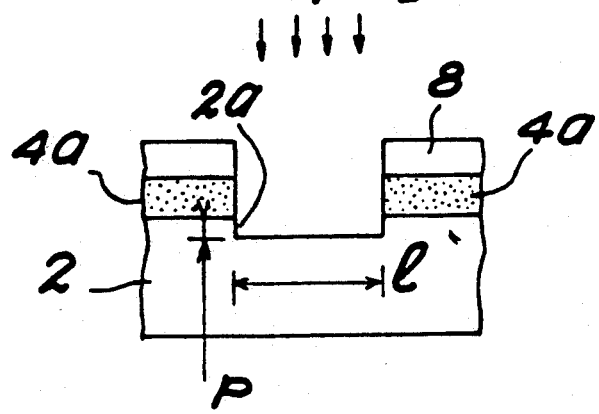
Figure 3B:
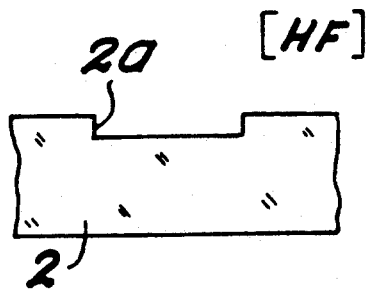
Figure 3C:
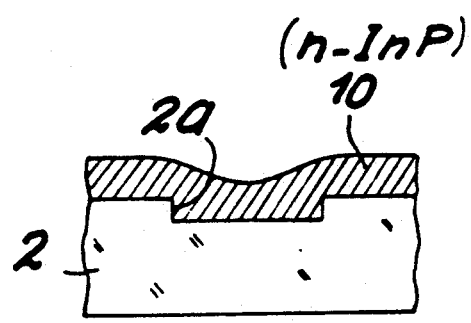
Figure 3D:
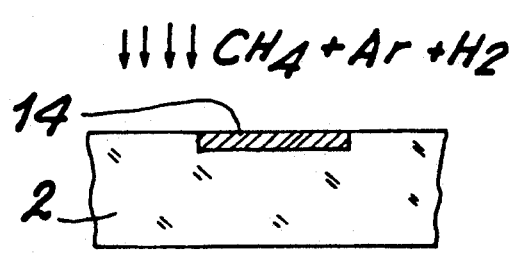

This is followed by a complete plate surface etching of the substrate using a gaseous mixture $CH_4+H_2+Ar$ of composition 20/30/50% by volume, with the same pressure and gaseous flow-rate conditions as those used during the local etching of the substrate (FIG. 3(a)), but with a radiofrequency power of approximately 20 watts. Cleaning or etching is carried out over 50 nm for 2 minutes.

In the manner shown in part (c) of FIG. 3, epitaxy then takes place of a n-doped InP layer 10 using silicon. This layer deposited by metallo-organic vapour phase chemical decomposition (MOCVD), or by molecular beam epitaxy (MBE) has a thickness of a few micrometers.

Through carrying out reactive ionic etching prior to epitaxy, a good crystalline quality epitaxy is obtained over the entire substrate surface.

If this stage of preparing the surface of the substrate 2 had not been carried out, only the epitaxy on the etched zone 2a would have given a layer of good crystalline quality, whilst the epitaxied layer on the unetched zones, i.e. protected by the $Si_3N_4$ mask would have had a polycrystalline-type disturbed appearance. This is due to the fact that the unetched substrate has surface qualities inferior to those of the etched material.

This is followed by reactive ionic etching of layer 10, according to the invention, under operating conditions like those described with reference to FIG. 3(a). The planar structure obtained is then that shown in part (d) of FIG. 3. The final configuration of the semiconductor, epitaxied layer is designated 14.

In the case of using a two-layer etching mask $Si_3N_4$—$SiO_2$, following the etching according to the invention of the substrate, the upper $SiO_2$ layer and the possibly formed polymer film are eliminated in a dilute HF solution, followed by MOCVD deposition of the semiconductor layer 10 and then the elimination of the $Si_3N_4$ mask, which simultaneously eliminates the regions of layer 10 surmounting the mask.

Figure 3E:
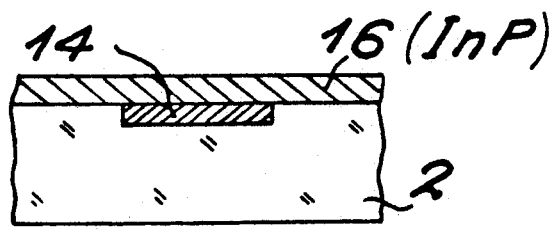

As shown in FIG. 3(e), the following stage consists of burying or embedding the semiconductor layer 14 by depositing on the complete structure a semi insulating layer 16 of III-V material, e.g. InP, by epitaxial growth of the MOCVD type, or e.g. a $SiO_2$ passivating insulating layer. Layer 16 has a thickness of approximately 200 nm.

The thus obtained structure can then serve either as a buried optical guide, or for producing a passivated MESFET.

As shown in FIG. 4, the production of a MESFET in III-V technology consists of depositing on insulating layer 16 a resin layer, like that conventionally used in photolithography in which is formed, as described relative to FIGS. 10(a) to 10(b), a lithography mask representing the image of the source, the drain and the gate of the transistor to be produced.

With the aid of the resin mask 18 obtained, there is a further RIE operation under the same conditions as those used relative to FIG. 3(a) and over a depth of 200 nm. This is followed by the deposition by cathodic sputtering on the structure obtained of a conductive layer 20 more particularly formed by two superimposed gold and germanium layers. This is followed by annealing at between 300° and 400° C. to form a gold and germanium alloy. Then and as shown in part (b), the resin layer 18 and those parts of the metal layer 20 positioned above the mask are eliminated by dissolving in acetone, said method being known as lift off.

The remaining metal layer regions are then respectively source 21, gate 22 and drain 24 of the field effect transistor.

The etching process according to the invention can also be used for producing a laser substrate like that shown in FIG. 13. There is firstly a surface cleaning of the semi insulating GaAs substrate 26 according to the invention, in order to aid the epitaxy of the substrate.

As indicated in part (a), this is successively followed by MOCVD or MBE epitaxy of a $n^+$-doped GaAs layer 28 with a thickness of a few micrometers, a 2 μm thick n-doped GaAlAs layer 30, a 100 nm thick GaAs layer 32 constituting the active layer of the laser, a 2 μm thick p-doped GaAlAs layer 34 and then a 500 nm thick $p^+$-doped GaAs layer 36 in which will be defined the ribbon structure of the laser defining the dimensions of the emission zone.

Using conventional photolithography processes, a photosensitive resin mask 38 is produced making it possible to mask the region of layer 36 in which will be defined the laser ribbon zone 36a. This is followed by the etching of layer 36 with a gaseous mixture according to the invention and pressure and radiofrequency power conditions like those described hereinbefore.

This is followed by the formation of an e.g. $Si_3N_4$ insulating layer 40 on the structure obtained, which is etched with a $CF_4$ plasma until the ribbon zone 36a is freed. The resin mask 38 is then eliminated by an oxygen plasma. The struture obtained is that shown in part (b) of FIG. 5.

Using the lift off method, an AuZn electric contact is then produced on the ribbon 36a of the laser obtained, followed by a TiAu electric supply line 44 of the ribbon by magnetron sputtering.

The etching process according to the invention can consequently be used for producing, as described hereinbefore, discrete components (MESFET transistors, laser structure), but also for producing lasers and field effect transistors integrated on the same substrate.

The process according to the invention makes it possible to obtain an anisotropic structure with perfectly smooth etching bases and perfectly rectilinear flanks or sides over submicron thicknesses and widths, which makes it possible to produce buried optical guides, networks and laser structures more easily than in the prior art processes. Furthermore, these optical components have little or no light loss.

The application examples of the etching process according to the invention given hereinbefore have obviously only been provided for illustration purposes and other semiconductor structures (diodes, photodetectors, memories) can be envisaged without passing outside the scope of the invention.

Moreover, the laser structures and MESFET transistors referred to hereinbefore can have shapes and stacks of layers different from those described and made from other III-V materials. In particular, the source and drain of the field effect transistor can be formed in the semi insulating substrate by local implantation of n or p-type ions.

We claim:

1. A process for the reactive ionic etching of a III-V material with a gaseous mixture, which comprises contacting a III-V material with a gaseous mixture containing by volume more than 15% and less than 40% of at least one gaseous hydrocarbon, more than 20% and less than 55% of at least one inert gas, and more than 5% and less than 65% of hydrogen, and etching said III-V material with said gaseous mixture.

2. Etching process according to claim 1, wherein the hydrocarbon is saturated or unsaturated and has 1 to 4 carbon atoms.

3. Etching process according to claim 1, wherein the hydrocarbon is methane.

4. Etching process according to claim 1, wherein the inert gas is chosen from among neon, argon and krypton.

5. Etching process according to claim 1, wherein the inert gas is argon.

6. Etching process according to claim 1, wherein the gaseous mixture contains at least 30% argon.

7. Etching process according to claim 1, wherein the gaseous mixture contains by volume 20 to 30% methane, 30 to 50% argon and 20 to 50% hydrogen.

8. Etching process according to claim 1, wherein the gaseous mixture contains by volume 20% methane, 50% argon and 30% hydrogen.

9. Etching process according to claim 1, wherein the gaseous mixture has a pressure between 1 and 4 Pa.

10. Etching process according to claim 1, wherein the gaseous mixture is ionized by radiofrequency waves, when III-V material is contacted with said gaseous mixture, the radiofrequency power being between 10 and 250 watts.

11. Etching process according to claim 1, wherein the III-V material is locally etched by using an etching mask representing an image of a zone to be etched.

12. Etching process according to claim 11, wherein mask is of silicon nitride.

13. Etching process according to claim 15, wherein the III-V material is chosen from among InP, GaSb, $Ga_{1-x}In_xAs$, $Ga_{1-x}In_xAs_{1-y}P_y$, GaAs and $Ga_{1-x}Al_xAs$, with $0<x<1$ and $0<y<1$.

14. A process for the epitaxial growth of a semiconductor layer of a III-V material on a monocrystalline substrate of a second III-V material, comprising a first stage of ionic etching said substrate by contacting said substrate with a gaseous mixture, said gaseous mixture containing by volume more than 15% and less than 40% of at least one gaseous hydrocarbon, more than 20% and less than 55% of at least one inert gas, and more than 5% and less than 65% of hydrogen, and etching said substrate with said gaseous mixture, thereafter depositing said semiconductor layer on said substrate by epitaxial growth.

* * * * *